(12) United States Patent
Felder et al.

(10) Patent No.: US 7,706,473 B2
(45) Date of Patent: Apr. 27, 2010

(54) COMPARATIVE SIGNAL STRENGTH DETECTION

(75) Inventors: Matthew D. Felder, Austin, TX (US); Michael R. May, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1064 days.

(21) Appl. No.: 11/388,675

(22) Filed: Mar. 24, 2006

(65) Prior Publication Data

US 2007/0223631 A1 Sep. 27, 2007

(51) Int. Cl.
*H04L 25/06* (2006.01)
(52) U.S. Cl. .................................................. 375/317
(58) Field of Classification Search .............. 375/316, 375/317, 319; 341/164
See application file for complete search history.

(56) References Cited

U.S. PATENT DOCUMENTS

| | | | | |
|---|---|---|---|---|
| 5,636,252 | A * | 6/1997 | Patel et al. | 375/345 |
| 2003/0012393 | A1* | 1/2003 | Armstrong | 381/321 |
| 2004/0043733 | A1* | 3/2004 | Marrah et al. | 455/138 |
| 2006/0003726 | A1* | 1/2006 | Razzell | 455/323 |
| 2006/0017602 | A1* | 1/2006 | Puma et al. | 341/164 |
| 2006/0052070 | A1* | 3/2006 | Jin et al. | 455/127.2 |
| 2006/0188042 | A1* | 8/2006 | Takatz et al. | 375/345 |
| 2007/0026837 | A1* | 2/2007 | Bagchi | 455/333 |
| 2007/0081615 | A1* | 4/2007 | Khoini-Poorfard et al. | 375/345 |
| 2007/0223631 | A1* | 9/2007 | Felder et al. | 375/345 |

OTHER PUBLICATIONS

Robert G. Meyer, Low-Power Monolithic RF Peak Detector Analysis, IEEE Journal of Solid-State Circuits, vol. 30, No. 1, Jan. 1995 (pp. 65-67).
Lopez-Martin, et al, A Current-Mode CMOS RMS-DC Converter For Very Low-Voltage Applications, IEEE 2001,Dept.Electrical Eng. ,Public University of Navarra (pp. 425-428).
Lopez-Martin, et al, A 3.3V CMOS RMS-DC Converted Based on the MOS Translinear Principle, Dept. Electrical Eng., Public University of Navarra (pp. 1-16).

* cited by examiner

*Primary Examiner*—Chieh M Fan
*Assistant Examiner*—Jaison Joseph
(74) *Attorney, Agent, or Firm*—Dillon & Yudell LLP

(57) ABSTRACT

A method for signal strength detection begins by comparing a signal strength representation of a signal with a signal strength representation of a reference signal. The method continues by adjusting, when the signal strength representation of the signal compares unfavorably with the signal strength representation of the reference signal, at least one of the signal strength representation of the signal and the signal strength representation of the reference signal until the signal strength representation of the signal compares favorably with the signal strength representation of the reference signal. The method continues by determining signal strength of the signal based on the adjusting of the signal strength representation of the signal and signal strength of the reference signal.

21 Claims, 8 Drawing Sheets radio receiver 10 section of radio receiver 10 signal strength detection module 50 resistive divider 82

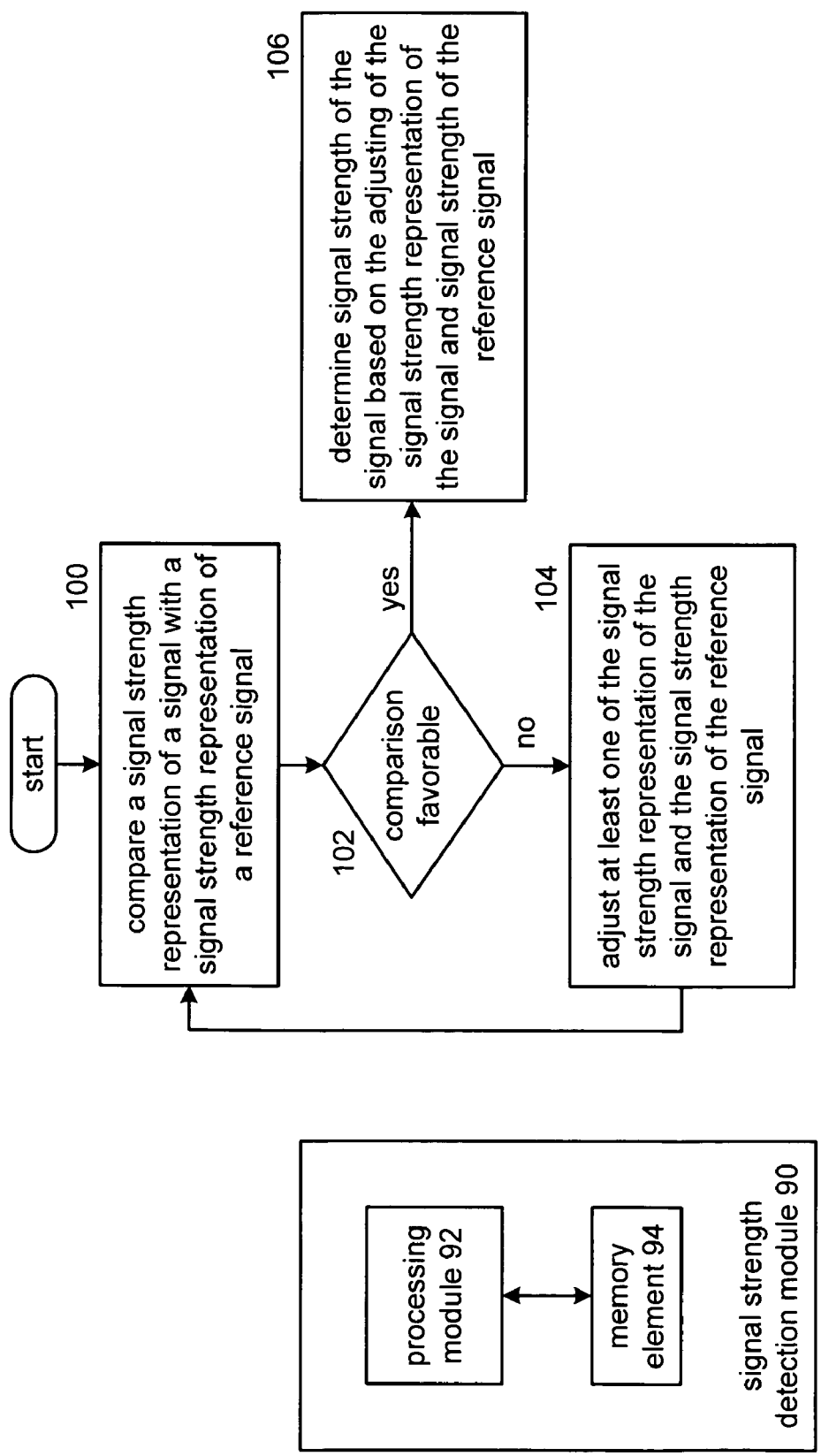

COMPARATIVE SIGNAL STRENGTH DETECTION

CROSS REFERENCE TO RELATED PATENTS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to signal processing and more particularly to determining signal strength of a signal.

2. Description of Related Art

As is known, wireless communication devices (e.g., a radio receiver) may tune to receive a selected radio frequency (RF) signal from within a frequency band of interest. For example, a frequency modulated (FM) radio receiver has a frequency band of interest from approximately 76 MHz to 108 MHz, where radio stations transmit on particular frequencies (e.g., 103.5 MHz). Thus, even though the radio receiver is tuned to a particular channel (e.g., 103.5 MHz), it has to be capable of receiving the entire frequency band of interest. This may present an issue if the signal strength detection for automatic gain control (AGC) is based on a narrow band signal (e.g., the particular station of 103.5 MHz) and not on the wide band signal (e.g., the frequency band of interest) being received.

For instance, if AGC is based solely on the narrow band signal and the wide band signal includes significant energy outside of the narrow band signal (e.g., outside of the selected channel), the low noise amplifier and/or the analog to digital converter of the radio receiver may saturate, causing an error. Accordingly, most radio receivers include a wide band signal strength detector for the automatic gain control.

As is further known, there are a variety of ways in which a wide band signal strength detector may be implemented. For example, a signal strength detector may be implemented as a peak detector or as an RMS (root mean square) detector. Issues with such detectors include complexity of circuit design, power consumption, accuracy, and bandwidth limitations of signals being detected.

Therefore, a need exists for a method and apparatus of signal detection that overcomes at least one of the above mentioned issues.

BRIEF DESCRIPTION OF THE SEVERAL VIEWS OF THE DRAWING(S)

FIG. 6 is a schematic block diagram of another embodiment of a signal strength detection module in accordance with the present invention;

FIG. 7 is a logic diagram of a method for signal strength detection in accordance with the present invention;

DETAILED DESCRIPTION OF THE DRAWINGS

Figure 1:
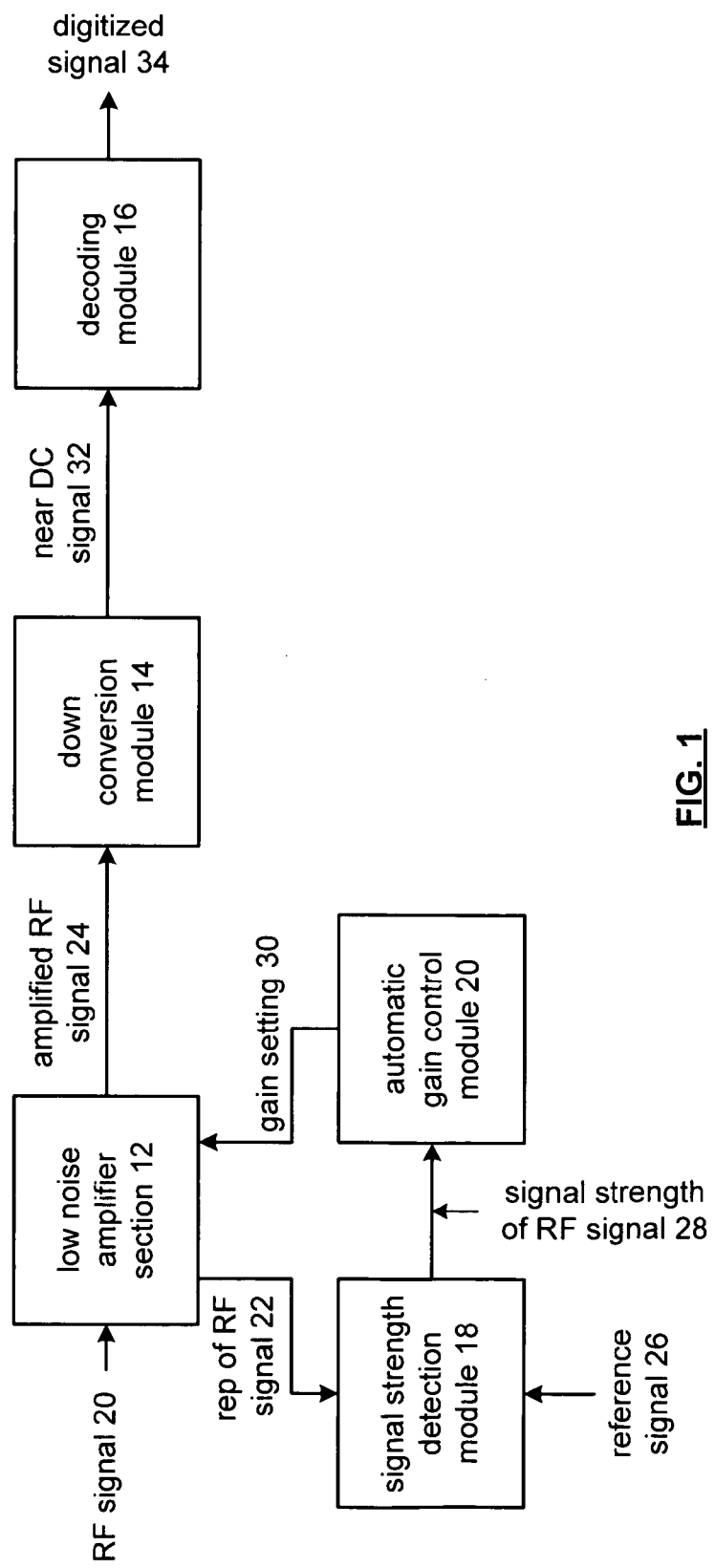
FIG. 1 is a schematic block diagram of a radio receiver in accordance with the present invention.

FIG. 1 is a schematic block diagram of a radio receiver 10 that includes a low noise amplifier section 12, a down conversion module 14, a decoding module 16, a signal strength detection module 18, and an automatic gain control module 20. The radio receiver 10 may be used in almost any wireless communication device that receives a wide bandwidth radio frequency (RF) signal. For example, the radio receiver 10 may be an FM (frequency modulation) radio receiver that receives a wide bandwidth FM RF signal.

In operation, the low noise amplifier section 12 amplifies an RF signal 20 based on a gain setting 30 to produce an amplified RF signal 24. The low noise amplifier section 12 provides a representation 22 of the RF signal 20 to the signal strength detection module 18. The representation 22 of the RF signal may be the RF signal 20, an amplified version thereof, or a scaled version thereof. The signal strength detection module 18 compares the representation 22 of the RF signal 20 with a reference signal 26 to produce a signal strength indication of the RF signal 28. The automatic gain control module 20 interprets the signal strength of the RF signal 28 to produce the gain setting 30. The functionality of the signal strength detection module 18 will be described in greater detail with reference to FIGS. 3-8.

The down conversion module 14 converts the amplified RF signal 24 into a near DC signal 32. The near DC signal 32 may have an intermediate frequency at DC or up to a few megahertz. The decoding module 16 converts the near DC signal 32 into a digitized signal 34. In one embodiment, the near DC signal 32 is a composite FM signal wherein the decoding module 16 converts the composite FM signal into a digitized audio signal.

Figure 2:
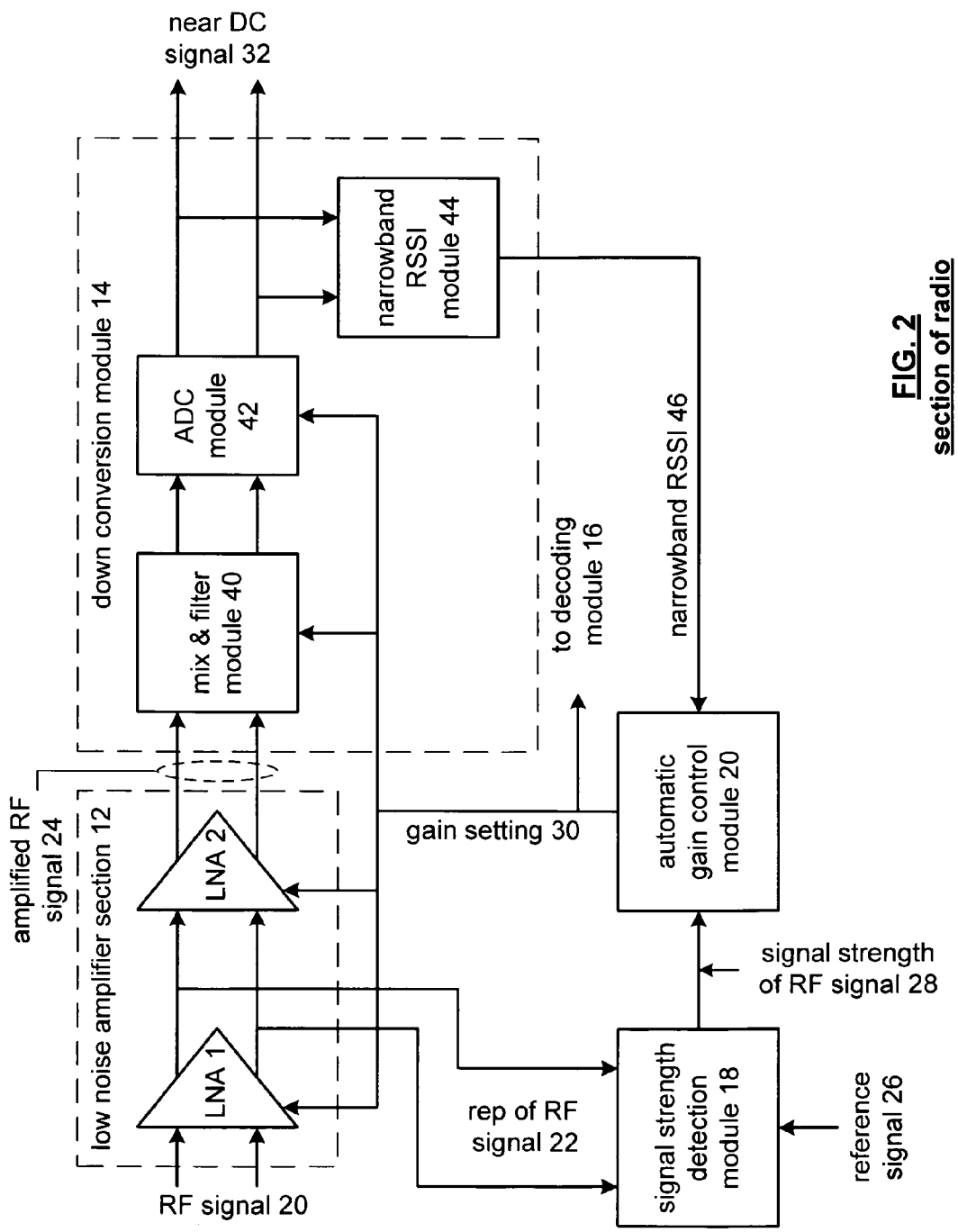
FIG. 2 is a schematic block diagram of a section of a radio receiver in accordance with the present invention.

FIG. 2 is a schematic block diagram of the LNA section 12, the down conversion module 14, the signal strength detection module 18, and the AGC module 20 of the radio receiver 10. In this diagram, the low noise amplifier section 12 includes two low noise amplifiers (LNA1 and LNA2); and the down conversion module 14 includes a mix and filter module 40, an analog-to-digital conversion (ADC) module 42, and a narrow band received signal strength indication (RSSI) module 44.

In this embodiment, the AGC module 20 generates the gain setting 30 based on the signal strength 28 of the RF signal 20, which corresponds to a wide band signal, and a narrowband RSSI 46, which corresponds to a narrow band signal. The gain settings 30 may include gain settings for each LNA of LNA section 12, for the mix & filter module 40, for the ADC module 42, and/or for the decoding module 16. In this embodiment, the AGC module 20 may shift the gain between the wide bandwidth signal components (e.g., the LNA section 12 and the mix & filter module 40) and the narrow bandwidth signal components (e.g., the ADC module 42 and the decoding module 16) based on the signal strength of the wide band signal in relation to the signal strength of the narrow band signal. For example, if the RF signal includes significant energy from undesired channels with respect to the signal strength of the desired narrow band channel, the wide band signal strength will be noticeably greater than the narrow band signal strength. In this instance, more gain should be placed in the narrow bandwidth signal components and less in the wide bandwidth signal components to avoid saturating the wide bandwidth signal components, but still provide the desired signal levels for the narrow band signal.

To generate the signal strength 28 of the RF signal 20, the signal strength detection module 18 receives a differential representation 22 of the RF signal 20 from the first LNA of LNA section 12. The signal strength detection module 18 compares the differential representation of the RF signal 22 with the reference signal 26 to produce a signal strength indication 28 of the RF signal 20.

The mix and filter module 40 effectively mixes the amplified RF signal 24 with a local oscillation frequency and performs the equivalent of a low pass or band pass filter on the resulting mixed signal to produce an analog near DC signal. The analog-to-digital conversion module 42 converts the analog near DC signal into the near DC signal 32, which is in the digital domain. The narrow band RSSI module 44 determines the signal strength of the digital near DC signal 32. Note that if the mix and filter module 40 and/or the ADC module 42 receives a gain setting 30, the modules 40 and/or 42 perform their respective functions based on the corresponding gain setting 30.

Figure 3:
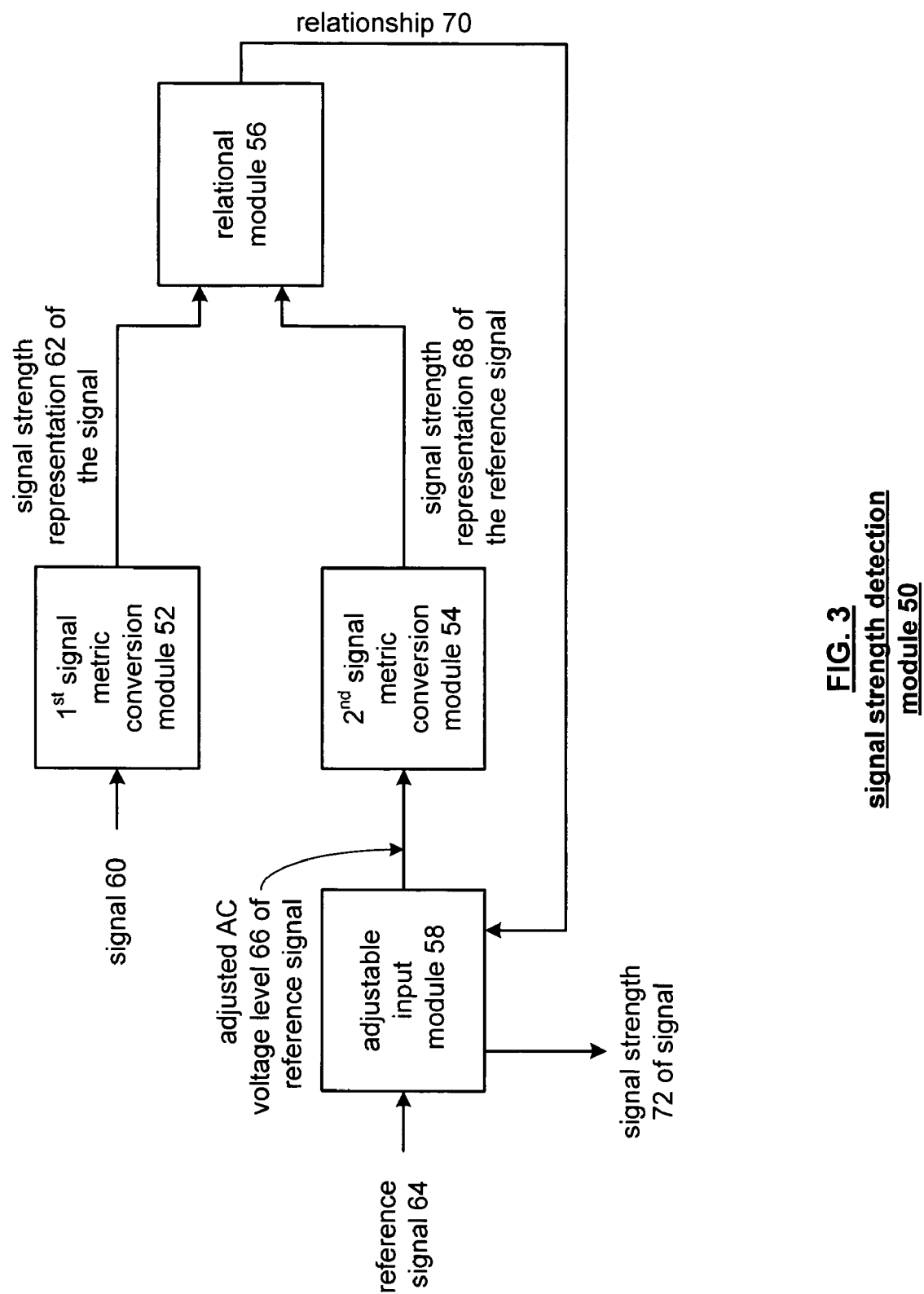
FIG. 3 is a schematic block diagram of a signal strength detection module in accordance with the present invention.

FIG. 3 is a schematic block diagram of a signal strength module 50 that may be used as the signal strength detection module 18 of FIGS. 1 and 2 but also has applicability in other types of circuits. In this embodiment, the signal strength detection module 50 includes a $1^{st}$ signal metric conversion module 52, a $2^{nd}$ signal metric conversion module 54, a relational module 56, and an adjustable input module 58.

In operation, the $1^{st}$ signal metric conversion module 52 receives a signal 60, which may be RF signal 20 or 22 of FIGS. 1 and 2, and performs a signal metric conversion upon the signal 60 to produce a signal strength representation 62 of the signal. The $1^{st}$ signal metric conversion module 52 may perform a root means square computation, a peak detection, an average computation, and/or an envelope detection to produce the signal strength representation 62 of the signal.

The $2^{nd}$ signal metric conversion module 54 performs a signal metric conversion upon an adjusted AC voltage level 66 of a reference signal 64 to produce a signal strength representation 68 of the reference signal 64. The adjustable input module 58 is operably coupled to adjust the AC voltage level of a reference signal 64, which may be reference signal 26 of FIG. 1 or 2, based on a relationship 70 between the signal strength representation 62 of the signal and the signal strength representation 68 of the reference signal to produce the adjusted AC voltage level 66. Note that the adjustable input module 58 is initialized with an initial adjustment value when the signal strength detection module 50 becomes active.

The relational module 56 compares the signal strength representation 62 of the signal 60 with the signal strength representation 68 of the reference signal 64 to produce the relationship 70. For example, if the $1^{st}$ and $2^{nd}$ signal metric conversion modules 52 and 54 perform an RMS computation, the signal strength representations 62 and 68 will be RMS values of the corresponding signals 60 and 64. The relationship 70 will indicate a difference between the RMS values of the signal strength representations 62 and 68. The adjustable input module 58 adjusts the AC voltage level 66 of reference signal 64 based on the difference between the signal strength representations 62 and 68. With the AC voltage level of the reference signal adjusted, the $2^{nd}$ signal metric conversion module 54 produces a signal strength representation 68 of the reference signal with an adjusted AC voltage level. The relational module 56 again produces relationship 70 based on the signal strength representation 68 of the reference signal with the adjusted AC voltage level and the signal strength representation 62 of the signal.

When the difference between the signal strength representations 62 and 68 converges to near zero, the adjustable input module 58 produces a signal strength 72 of signal 60 based on the amount of adjusting of the reference signal 64. For example, if the reference signal 64 has a known magnitude of 0 dBm and the difference is 20 dB (e.g., the adjustment was a divide by 10), then the signal strength of the signal is −20 dBm.

Figure 4:
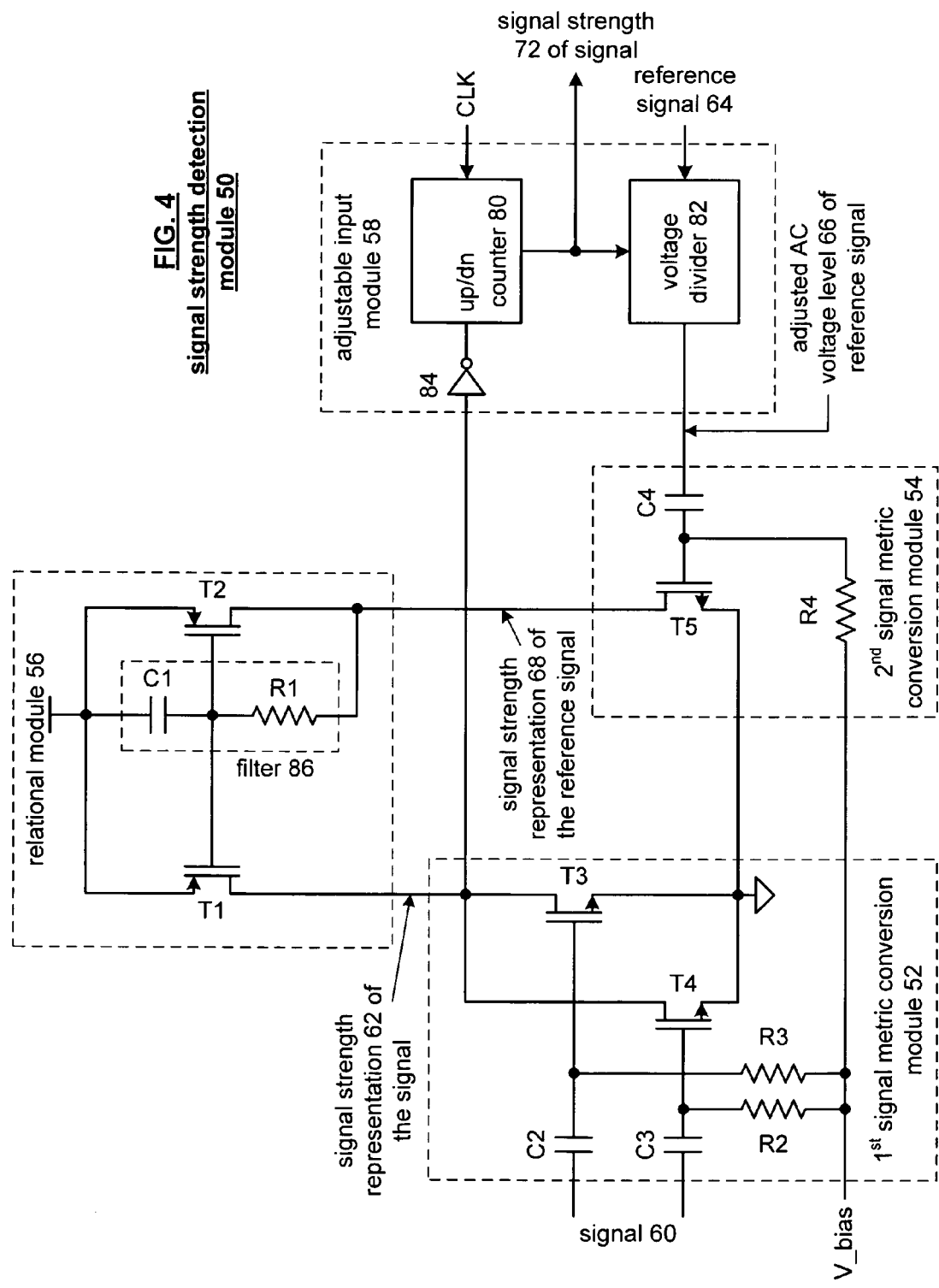
FIG. 4 is a schematic block diagram of another embodiment of a signal strength detection module in accordance with the present invention.

FIG. 4 illustrates a particular embodiment of the signal strength detection module 50. In this embodiment, the relational module 56 includes transistors T1 and T2 and a filter 86 that includes capacitor C1 and resistor R1. The $1^{st}$ signal metric conversion module 52 includes, for a differential signal, capacitors C2 and C3, resistors R2 and R3, and transistors T3 and T4. For a single-ended signal 60, the $1^{st}$ signal metric conversion module 52 would include capacitor C2, resistor R3, and transistor T3. The $2^{nd}$ signal metric conversion module 54 includes a capacitor C4, resistor R4, and transistor T5. The adjustable input module 58 includes an inverter 84, a counter 80, and a voltage divider 82. Note that the sizing of transistors T1-T5 may have transistors T1 and T2 of equal size, T3 and T4 of equal size and transistor T5 being approximately twice that size of T3 or T4 when signal 60 is differential. If signal 60 is a single-ended signal, which would eliminate the need for transistor T4, then transistors T3 and T5 would be of equal size. Further note that transistors T2 and T5 can both be increased or decreased by the same factor (compared to transistors T1 and T3) with negligible effects on circuit functionality. In one embodiment, the size of transistors T2 and T5 is greater than the size of transistors T1 and T3. Still further note that one or more of transistors T1-T5 may have associated therewith one or more cascoded transistors.

In operation, transistors T3 and T4 of the $1^{st}$ signal metric conversion module 52 and transistor T5 of the $2^{nd}$ metric conversion module 54 are biased with a voltage (V_bias) and AC coupled via capacitors C2, C3 and C4 to their respective inputs: signal 60 and adjustable AC voltage level 66 of reference signal 64. The transistors T1 and T2 of relational module 56 are biased, via filter 86 (which attenuates a linear component of the signal strength representation of the reference signal), to mirror the current of each other. As configured, the current into the drain of transistor T3 of the $1^{st}$ signal metric conversion module 54 corresponds to the signal strength representation 62 of the signal 60 and the current into the drain of transistor T5 of the $2^{nd}$ signal metric conversion module 54 corresponds to the signal strength representation 68 of reference signal 64.

In operation, counter 80 is initially set to zero for an up counter (or to a maximum value for a down counter). The voltage divider 82 receives the initial count form counter 80 and sets its divider ratio to divide-by-1. The number of bits used to indicate the count produced by counter 80 indicates the granularity of voltage divisions that may be performed by voltage divider 82. For example, 4 bits indicate 16 different voltage divisions that may be performed by voltage divider 82. In addition, the count produced by counter 80 provides a digital representation of the signal strength 72 of the signal 60.

With the counter 80 initialized, the voltage divider 82 divides the reference signal 64 by 1 such that the adjusted AC voltage level 66 of reference signal 64 is at the same level as the AC voltage level of reference signal 64. Note that in one embodiment, the reference signal 64 may be a clock signal that has a frequency comparable to the frequency of the signal 60. The $2^{nd}$ metric conversion module 54 generates a current that represents an RMS value of the adjusted AC voltage level 66 of reference signal 64. This may be done in accordance with the equation:

$$I = I_{DC} + g_m * Vgs + \frac{g_m * Vgs^2}{2(V_{GS} - V_T)}$$

where $g_m*Vgs$ is a linear term that is removed by the filter 86, $2(V_{GS}-V_T)$ is a DC portion that is removed by AC coupling, thus I is approximately equal to $g_m Vgs^2$, which approximates a mean of the square function. Note that, in this embodiment, the mean of the square function may be used to approximate a root mean square (RMS) function.

Similarly, the $1^{st}$ signal metric conversion module 52 converts the signal 60 into a current that represents an RMS value of the signal strength of signal 60. If the magnitude of the reference signal 64 is set at a maximum value at which signal 60 may be received and the signal 60 is not at the potential maximum value, the signal strength representation 62 will swing to a logic high voltage (since the T1 current will be larger than the T3 & T4 currents). The logic high voltage of the signal strength representation 62 will cause inverter 84 to present a count-down signal to the counter 80.

With the inverter 84 toggled the counter 80 counts up (or down), which causes the voltage divider 82 to divide the reference signal 64 by a new fixed value. For example, if this is the first clocked count-down signal, the divider ratio may change from a divide-by-1 to a divide-by-4. In general, the divider ratio will be set based on the range of the signal strength of the signal and the number of bits in the count. For example, if the signal strength of the signal 60 may range from 0 dBm to −100 dBm, and the count is a 4-bit count, the divider ratio may be 100 dB/16, which equals 6.25 dB per step. In practice, a 6 dB per step may be used. Note that finer granularity may be obtained by using a high bit counter.

With the counter performing a $1^{st}$ count down, the voltage divider 82 divides the reference signal 64 by 4 to produce the adjusted AC voltage level 66 of reference 64. In this example, the adjusted AC voltage level 66 is one-fourth that of reference signal 64. Note that other divider levels may be used by voltage divider 82.

The $2^{nd}$ signal metric conversion module 54 produces a current that represents an RMS value of the adjusted AC voltage level 66 as indicated by signal strength representation 68. The $1^{st}$ signal metric conversion module 52 produces a similar current that represents the RMS value of signal strength representation 62 of signal 60. In this instance, if the signal level of the signal 60 is still below the adjusted AC voltage level 66, the inverter 84 will again provide a count-down signal to the counter 80. This causes the voltage divider 82 to divide the reference signal 64 by the next divider value to produce a new adjusted AC voltage level 66. This continues until the adjusted AC voltage level 66 of reference signal 64 is less than the AC voltage level of signal 60. Once this occurs, the current into transistors T3 & T4 will be greater than the current into transistor T5, which establishes a logic low input voltage to the inverter 84 that then provides a count-up signal to the counter. This will cause the adjusted AC voltage level 66 to be increased and will result in a toggling between the two count values where the adjusted AC voltage level 66 is higher, then lower than signal 60. When the counter is toggling between two values the RMS value is considered to be "resolved". The signal strength 72 of the signal may be based on one or both of the toggling count values.

Figure 5:
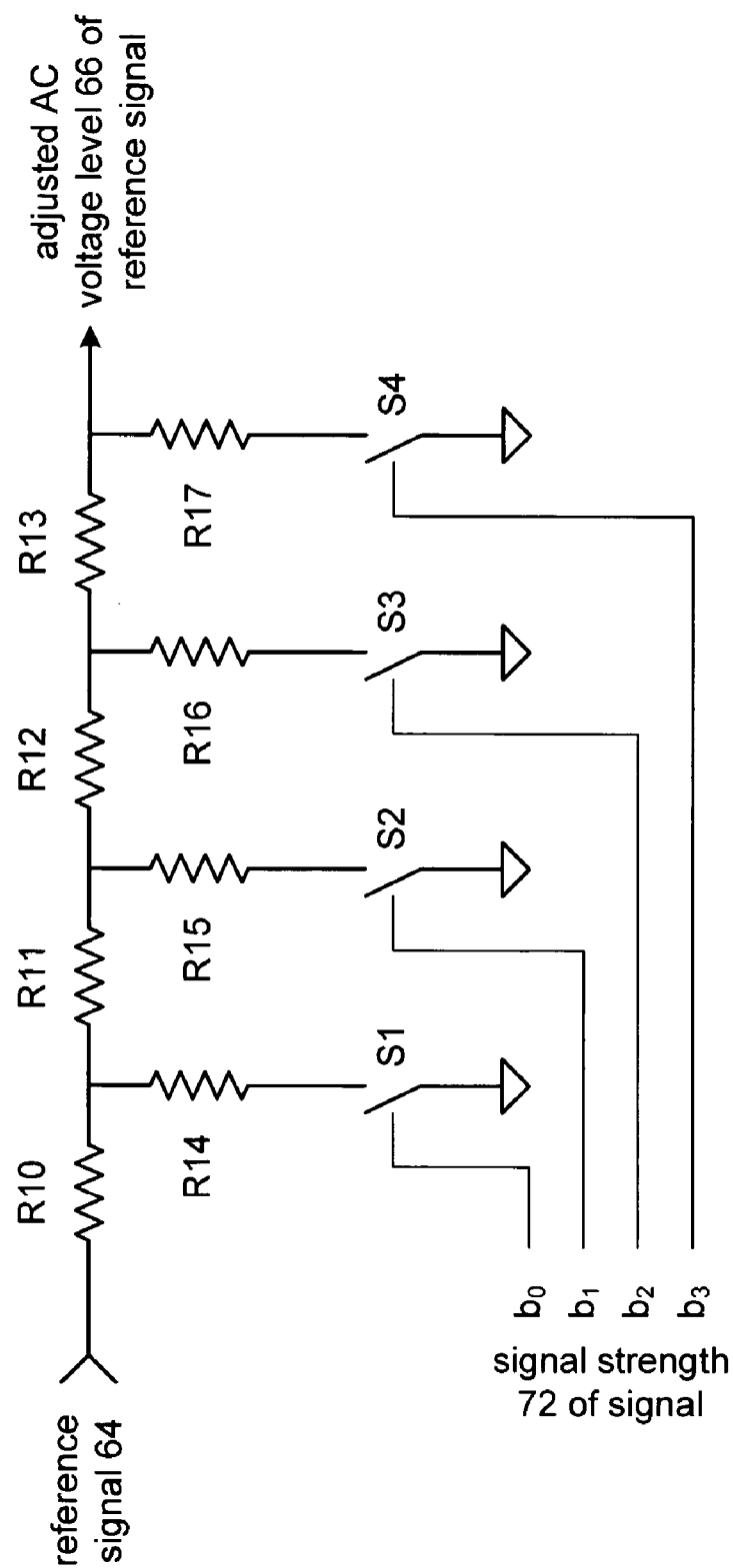
FIG. 5 is a schematic block diagram of an embodiment of a resistive divider in accordance with the present invention.

FIG. 5 is a schematic block diagram of an embodiment of the resistive divider 82 that includes a plurality of resistive pairs (e.g., R10 & R14, R11 & R15, R12 & R16, and R13 & R17) and a plurality of switching elements (e.g., S1-S4). Each resistive pair has a corresponding divider ratio that provide a desired step change of a divider value of the resistive divider in accordance with a corresponding change of a control signal (e.g., the signal strength 72). The plurality of switching elements (e.g., S1-S4) enables at least one of the plurality of resistive pairs to provide the divider value for the resistive divider network based on a state of the control signal. In one embodiment, the desired step change comprises a logarithmic step change. In another embodiment, a first divider ratio of the plurality of corresponding divider ratios including a divide-by-$x^{1*n}$ ratio; a second divider ratio of the plurality of corresponding divider ratios including a divide-by-$x^{2*n}$ ratio; and a third divider ratio of the plurality of corresponding divider ratios including a divide-by-$x^{3*n}$ ratio, where "n" is an integer and "x" is a real number.

As an example, the divider 82 provides a 16 step, −1 dB per step, logarithmic divider where n=1 and x=2 such that R10 & R14 provide a divide by 1.12 that is gated via the least significant bit of the signal strength 72, R11 & R15 provide a divide by (1.12^2) that is gated via the second least significant bit of the signal strength 72, R12 & R12 provide a divide by (1.12^4) that is gated via the second most significant bit of the signal strength 72, and R13 & R17 provide a divide by (1.12^8) that is gated via the most significant bit of the signal strength 72. With these resistors values, the following divider ratios may be achieved with a four-bit signal strength 72.

| Signal Strength 72 | Divide-by-Value | Step Value in dB |
|---|---|---|
| 0000 | 0 | 0 |
| 0001 | .1.12 | −1 |
| 0010 | 1.26 | −2 |
| 0011 | 1.41 | −3 |
| 0100 | 1.58 | −4 |
| 0101 | 1.78 | −5 |
| 0110 | 2.0 | −6 |
| 0111 | 2.23 | −7 |
| 1000 | 2.51 | −8 |
| 1001 | 2.82 | −9 |
| 1010 | 3.16 | −10 |
| 1011 | 3.54 | −11 |
| 1100 | 4.0 | −12 |
| 1101 | 4.47 | −13 |
| 1110 | 5.01 | −14 |
| 1111 | 5.62 | −15 |

As another example, a resistive divider 82 includes three resistive pairs where the logarithmic step is −3 dB and the control signal is a 3-bit signal. For this example, n=1 and x=$2^{1/2}$ such that the first resistive pair provides a divide-by-$2^{1/2}$, the second resistive pair provides a divide-by-2, and the third resistive pair provides a divide-by-4. Accordingly, this example of a resistive network provides a divider scale from 0 dB to −21 dB at −3 dB increments.

As one of average skill in the art will appreciate, other resistive divider ratios may be used to obtain a different logarithmic resistive divider scale and/or may include more resistor pairs and corresponding bits of a control signal (e.g., the signal strength). As one of ordinary skill in the art will appreciate, the resistive divider 82 may be part of a bigger divider circuit that includes fixed divider resistive pairs and/or adjustable divider resistive pairs. As one of average skill in the art will still further appreciate, the resistive divider may be coupled in a parallel with another resistive network for adjusting the another resistive network, or the resistors may be more generalized impedance elements with reactive components. Lastly, the impedance ratios shown above may be approximated in practice, without deviating from the scope of the present invention.

FIG. 6 is a schematic block diagram of another embodiment of signal strength detection module 90, which may be used as signal strength detection module 18 of FIGS. 1 and 2 but may be used in other circuits as well. In this embodiment, the signal strength detection module 90 includes a processing module 92 and a memory element 94. The processing module 92 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory element 94 may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module 92 implements one or more of its functions via a state machine, analog circuitry, digital circuitry, and/or logic circuitry, the memory element storing the corresponding operational instructions may be embedded within, or external to, the circuitry comprising the state machine, analog circuitry, digital circuitry, and/or logic circuitry. Further note that, the memory element 94 stores, and the processing module 92 executes, operational instructions corresponding to at least some of the steps and/or functions illustrated in FIGS. 7-9.

FIG. 7 is a logic diagram of a method for signal detection that begins at Step 100 where a signal strength representation of a signal is compared with a signal strength representation of a reference signal. In one embodiment, a signal metric conversion may be performed on an AC voltage level of the reference signal to produce the signal strength representation of the reference signal, where the AC voltage level of the reference signal is at a known AC voltage. In addition, the signal metric conversion is performed on an AC voltage level of the signal to produce the signal strength representation of the signal. Such a signal metric conversion may be a root mean square computation, a mean of the square function, a peak detection, an average computation, and/or an envelope detection.

The process then proceeds to Step 102 where a determination is made as to whether the comparison was favorable. If not, the process proceeds to Step 104 where at least one of the signal strength representation of the signal and the signal strength representation of the reference signal is adjusted. In one embodiment, the adjusting may be done by amplifying the reference signal based on a $1^{st}$ adjustable gain prior to generating the signal strength representation of the reference signal. The $1^{st}$ adjustable gain may be set based on the comparing of the signal strength representation of the signal with the signal strength representation of the reference signal. Note that the $1^{st}$ adjustable gain may be a fraction or a whole number. Alternatively, the signal may be adjusted by amplifying it based on a $2^{nd}$ adjustable gain prior to generating the signal strength representation of the signal. In this embodiment, the $2^{nd}$ adjustable gain is based on the comparison between the signal strength representation of the signal and the signal strength representation of the reference signal.

With one of the signal strength representations adjusted, the process repeats at Step 100. The process then proceeds again to Step 102 where a determination is made if the comparison of an adjusted signal representation with the signal strength representation is favorable. If not, the process remains in a loop of Steps 100, 102 and 104 until the comparison is favorable.

Once the comparison at Step 102 is favorable, the process proceeds to Step 106. At Step 106, the signal strength is determined based on the adjusting of at least one of the signal strength representation of the signal and the signal strength representation of the reference signal. Note that in one embodiment as depicted in FIG. 4, a favorable comparison may correspond to the current into transistors T3 & T4 being alternatively greater than and less than the current into transistor T5, which causes the counter to toggle between two values. The signal strength of the signal may be based on one or both of the toggling count values.

Figure 8:
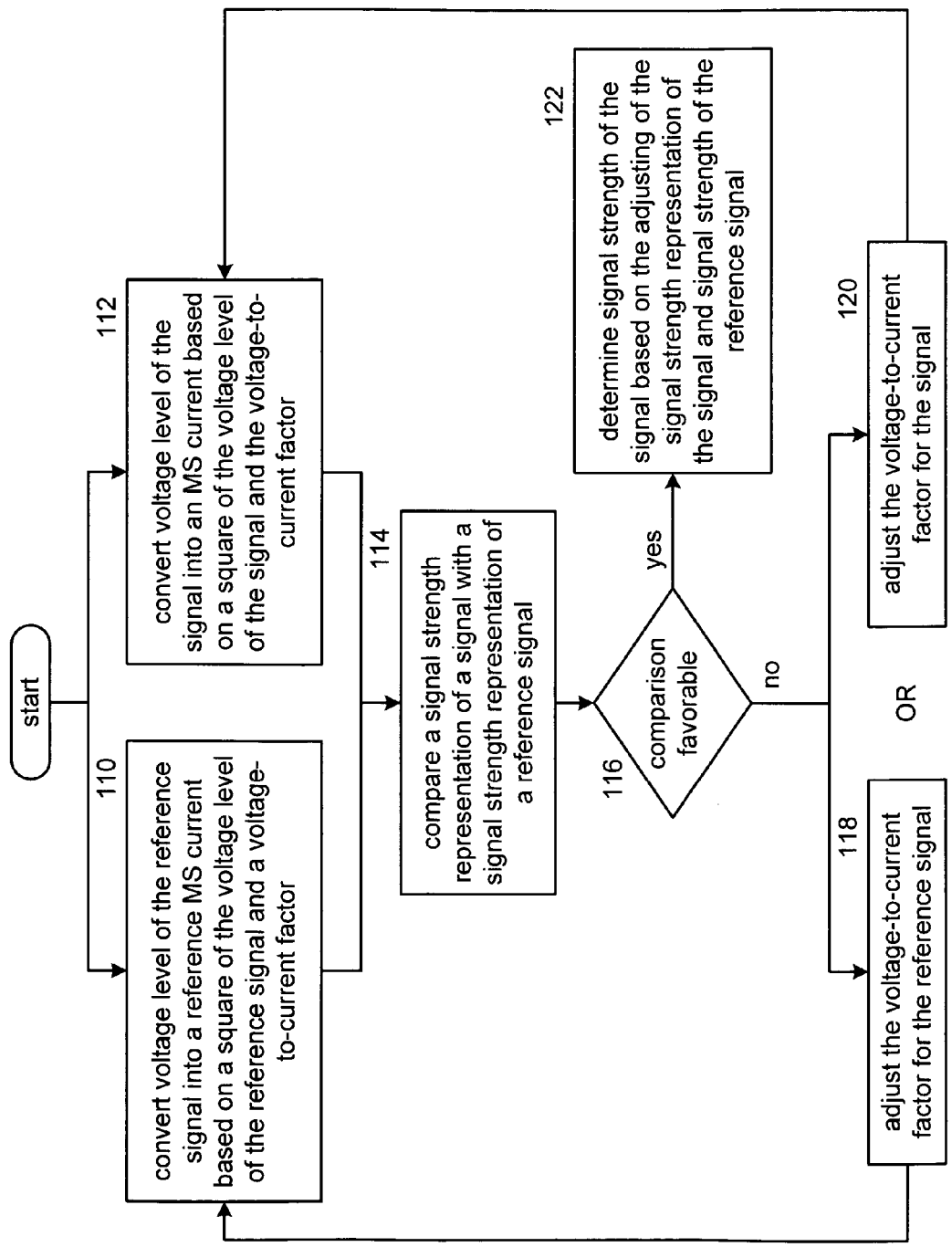
FIG. 8 is a logic diagram of another method for signal strength detection in accordance with the present invention.

FIG. 8 is a logic diagram of another method for signal strength detection. This method begins at Steps 110 and 112. At Step 110, an AC voltage level of a reference signal is converted into a reference MS (mean square, which may be based on a root mean square function or a mean of the square function) current based on a square of the AC voltage level of the reference signal and a voltage-to-current factor to produce the signal strength representation of the reference signal. At Step 112, an AC voltage level of the signal is converted into an MS current based on a square of the AC voltage level of the signal and the voltage-to-current factor to produce the signal strength representation of the signal. The voltage-to-current factor includes one or more of the transconductance of transistors used to convert the voltage-to-current, adjusting the size of the transistors (e.g., by switching in or out transistors in parallel to adjust its size), and/or by changing a reference level.

The process then proceeds to Step 114 where the signal strength representation of the signal is compared with the signal strength representation of the reference signal. The process then proceeds to Step 116 where a determination is made as to whether the comparison was favorable. If not, the process proceeds to either Step 118 or Step 120. At Step 118, the voltage-to-current factor of the reference signal is adjusted, which may be done by adjusting the transconductance of the transistors, adjusting the size of the transistors used for the conversion of Step 110, changing the biasing levels, and/or changing the magnitude of the AC voltage level. If Step 120 is used, the voltage-to-current factor of the signal is adjusted. The process then reverts to Steps 110 and 112 to produce a corresponding signal strength representation based on the adjusting of the reference signal or the signal. The process continues at Step 114 and Step 116 and remains in a loop until the comparison is favorable. Once the comparison at Step 116 is favorable, the process proceeds to Step 122 where the signal strength of the signal is determined based on the adjusting of the signal strength representation of the signal or the adjusting of the signal strength representation of the reference signal.

Figure 9:
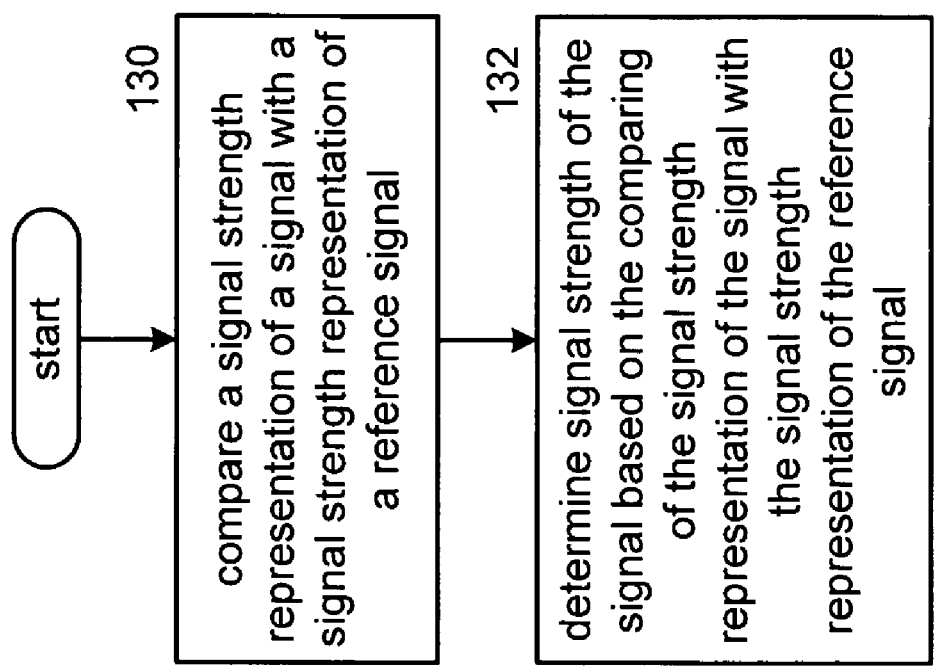
FIG. 9 is a logic diagram of yet another method of signal strength detection in accordance with the present invention.

FIG. 9 is a logic diagram of another method for signal strength detection. The process begins at Step 130 where a signal strength representation of a signal is compared with a signal strength representation of a reference signal. The process then proceeds to Step 132 where the signal strength of the signal is determined based on the comparing of the signal strength representation of the signal with the signal strength representation of the reference signal.

The method of FIG. 8 may further include generating a signal strength difference indication based on the comparing of the signal strength representation of a signal with the signal strength representation of a reference signal; and determining the signal strength of the signal based on the signal strength difference and a known signal strength of the reference signal.

The method of FIG. 9 may further include performing a signal metric conversion on an AC voltage level of the reference signal to produce the signal strength representation of the reference signal, wherein the AC voltage level of the reference signal is at a known AC voltage; and performing the signal metric conversion on an AC voltage level of the signal to produce the signal strength representation of the signal. In one embodiment, the signal metric conversion is a mean square computation (e.g., a root mean square function or a mean of the square function), a peak detection, an average computation, and/or an envelope detection.

The method of FIG. 9, when the mean square (MS) computation is used, or approximated using a mean of the square function, may further include converting the AC voltage level of the reference signal into a reference MS current based on a square of the AC voltage level of the reference signal and a voltage-to-current factor to produce the signal strength representation of the reference signal; and converting the AC voltage level of the signal into an MS current based on a square of the AC voltage level of the signal and the voltage-to-current factor to produce the signal strength representation of the signal.

Step 132 of the method of FIG. 9 may further include adjusting at least one of the signal strength representation of the signal and the signal strength representation of the reference signal until the signal strength representation of the signal substantially equals the signal strength representation of the reference signal, wherein the adjusting at least one of the signal strength representation of the signal and the signal strength representation of the reference signal includes at least one of: adjusting the voltage-to-current factor when converting the voltage level of the reference signal into the reference RMS current to adjust the signal strength representation of the reference signal; and adjusting the voltage-to-current factor when converting the voltage level of the signal into the RMS current to adjust the signal strength representation of the signal.

Step 132 of the method of FIG. 9 may further include adjusting at least one of the signal strength representation of the signal and the signal strength representation of the reference signal until the signal strength representation of the signal substantially equals the signal strength representation of the reference signal, wherein the adjusting at least one of the signal strength representation of the signal and the signal strength representation of the reference signal includes at least one of: amplifying the reference signal based on a first adjustable gain prior to generating the signal strength representation of the reference signal, wherein the first adjustable gain is set based on the comparing of the signal strength representation of the signal with the signal strength representation of the reference signal; and amplifying the signal based on a second adjustable gain prior to generating the signal strength representation of the signal, wherein the second adjustable gain is set based on the comparing of the signal strength representation of the signal with the signal strength representation of the reference signal.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "operably associated with", as may be used herein, includes direct and/or indirect coupling of separate components and/or one component being embedded within another component. As one of ordinary skill in the art will still further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The preceding discussion has presented a plurality of method and apparatus for signal strength detection. As one of ordinary skill in the art will appreciate, other embodiments may be derived from the teaching of the present invention without deviating from the scope of the claims.

What is claimed is:

1. A method for signal strength detection, the method comprising:
    comparing a signal strength representation of a signal with a signal strength representation of a reference signal;
    when the signal strength representation of the signal compares unfavorably with the signal strength representation of the reference signal, adjusting at least one of the signal strength representation of the signal and the signal strength representation of the reference signal until the signal strength representation of the signal compares favorably with the signal strength representation of the reference signal;
    determining signal strength of the signal based on the at least one of adjusting of the signal strength representation of the signal and the signal strength representation of the reference signal;
    performing a signal metric conversion on an AC voltage level of the reference signal to produce the signal strength representation of the reference signal, wherein the AC voltage level of the reference signal is at a known AC voltage;

performing the signal metric conversion on an AC voltage level of the signal to produce the signal strength representation of the signal;

wherein the signal metric conversion comprises a mean square computation; and wherein the mean square (MS) computation comprises;

converting the AC voltage level of the reference signal into a reference MS current based on a square of the AC voltage level of the reference signal and a voltage-to-current factor to produce the signal strength representation of the reference signal; and converting the AC voltage level of the signal into an MS current based on a square of the AC voltage level of the signal and the voltage-to-current factor to produce the signal strength representation of the signal.

2. The method of claim 1, wherein the adjusting at least one of the signal strength representation of the signal and the signal strength representation of the reference signal comprises:

adjusting the voltage-to-current factor when converting the AC voltage level of the reference signal into the reference MS current to adjust the signal strength representation of the reference signal; and adjusting the voltage-to-current factor when converting the AC voltage level of the signal into the MS current to adjust the signal strength representation of the signal.

3. The method of claim 1, wherein the adjusting at least one of the signal strength representation of the signal and the signal strength representation of the reference signal comprises at least one of:

amplifying the reference signal based on a first adjustable gain prior to generating the signal strength representation of the reference signal, wherein the first adjustable gain is set based on the comparing of the signal strength representation of the signal with the signal strength representation of the reference signal; and amplifying the signal based on a second adjustable gain prior to generating the signal strength representation of the signal, wherein the second adjustable gain is set based on the comparing of the signal strength representation of the signal with the signal strength representation of the reference signal.

4. A method for signal strength detection, the method comprising:

comparing a signal strength representation of a signal with a signal strength representation of a reference signal; and determining signal strength of the signal based on the comparing of the signal strength representation of the signal with the signal strength representation of the reference signal;

performing a signal metric conversion on an AC voltage level of the reference signal to produce the signal strength representation of the reference signal, wherein the AC voltage level of the reference signal is at a known AC voltage;

performing the signal metric conversion on an AC voltage level of the signal to produce the signal strength representation of the signal;

wherein the signal metric conversion comprises a mean square computation;

wherein the mean square (MS) computation comprises:

converting the AC voltage level of the reference signal into a reference MS current based on a square of the AC voltage level of the reference signal and a voltage-to-current factor to produce the signal strength representation of the reference signal; and converting the AC voltage level of the signal into an MS current based on a square of the AC voltage level of the signal and the voltage-to-current factor to produce the signal strength representation of the signal.

5. The method of claim 4 further comprises:

generating a signal strength difference indication based on the comparing of the signal strength representation of a signal with the signal strength representation of a reference signal; and determining the signal strength of the signal based on the signal strength difference and a known signal strength of the reference signal.

6. A method for signal strength detection, the method comprising:

comparing a signal strength representation of a signal with a signal strength representation of a reference signal; and determining signal strength of the signal based on the comparing of the signal strength representation of the signal with the signal strength representation of the reference signal;

wherein the determining signal strength of the signal comprises:

adjusting at least one of the signal strength representation of the signal and the signal strength representation of the reference signal until the signal strength representation of the signal substantially equals the signal strength representation of the reference signal, wherein the adjusting at least one of the signal strength representation of the signal and the signal strength representation of the reference signal includes at least one of:

adjusting the voltage-to-current factor when converting the AC voltage level of the reference signal into the reference MS current to adjust the signal strength representation of the reference signal; and adjusting the voltage-to-current factor when converting the AC voltage level of the signal into the MS current to adjust the signal strength representation of the signal.

7. A signal strength detection module comprises:

a first signal metric conversion module operably coupled to convert an AC voltage level of signal into a signal strength representation of the signal;

a second signal metric conversion module operably coupled to convert an AC voltage level of a reference signal into a signal strength representation of the reference signal;

a relational module operably coupled to establish a relationship between the signal strength representation of the signal and the signal strength representation of the reference signal; and adjustable input module operably coupled to adjust the AC voltage level of the reference signal based on the relationship between the signal strength representation of the signal and the signal strength representation of the reference signal until the relationship indicates that the signal strength representation of the signal corresponds to the signal strength representation of the reference signal, wherein the signal strength representation of the reference signal is based on the adjusting of the voltage level of the reference signal and a known signal strength of the reference signal.

8. The signal strength detection module of claim 7 further comprises:

the first signal metric conversion module includes a first transistor having an input, a first node, and a second node, wherein the input of the first transistor is operably coupled to receive the signal, wherein the second node of the first transistor is operably coupled to a return, and wherein the signal strength representation of the signal is provided at the first node of the first transistor;

the second signal metric conversion module includes a second transistor having an input, a first node, and a second node, wherein the input of the second transistor is operably coupled to receive an adjusted reference signal from the adjustable input module, wherein the second node of the second transistor is operably coupled to the return, and wherein the signal strength representation of the reference signal is provided at the first node of the second transistor; and the relational module includes a third transistor and a fourth transistor, wherein inputs of the third and fourth transistors are operably coupled to the first node of the second transistor, wherein the first nodes of the third and fourth transistors are operably coupled to a voltage supply, wherein the second node of the third transistor is operably coupled to the first node of the first transistor, and wherein the second node of the fourth transistor is operably coupled to the first node of the second transistor.

9. The signal strength detection module of claim 8, wherein the relationship module further comprises:

a filter operably coupled to the inputs of the third and fourth transistors, wherein the filter attenuates a linear component of the signal strength representation of the reference signal.

10. The signal strength detection module of claim 8, wherein the first signal metric conversion module further comprises:

a fifth transistor having an input, a first node, and a second node, wherein the input of the fifth transistor is operably coupled to receive a first differential leg of the signal, wherein the second node of the fifth transistor is operably coupled to the return, wherein the input of the first transistor is operably coupled to receive a second differential leg of the signal, and wherein the signal strength representation of the signal is provided at the first nodes of the first and fifth transistors.

11. The signal strength detection module of claim 8, wherein the adjustable input module comprises:

a counter operably coupled to count up or down based on a logic state of first node of the first transistor to produce a count; and a divider module operably coupled to divide a voltage level of the reference signal based on the count.

12. A signal strength detection module comprising:

a processing module; and a memory element operably coupled to the processing module, wherein the memory element includes operational instructions that cause the processing module to:

compare a signal strength representation of a signal with a signal strength representation of a reference signal;

when the signal strength representation of the signal compares unfavorably with the signal strength representation of the reference signal, adjust at least one of the signal strength representation of the signal and the signal strength representation of the reference signal until the signal strength representation of the signal compares favorably with the signal strength representation of the reference signal; and determine signal strength of the signal based on the at least one of adjusting of the signal strength representation of the signal and the signal strength representation of the reference signal;

wherein the memory element further comprises operational instructions that cause the processing module to:

perform a signal metric conversion on an AC voltage level of the reference signal to produce the signal strength representation of the reference signal, wherein the AC voltage level of the reference signal is at a known AC voltage; and perform the signal metric conversion on an AC voltage level of the signal to produce the signal strength representation of the signal;

wherein the signal metric conversion comprises a mean square computation;

wherein the memory element further comprises operational instructions that cause the processing module to process the mean square (MS) computation by:

converting the AC voltage level of the reference signal into a reference MS current based on a square of the AC voltage level of the reference signal and a voltage-to-current factor to produce the signal strength representation of the reference signal; and converting the AC voltage level of the signal into an MS current based on a square of the AC voltage level of the signal and the voltage-to-current factor to produce the signal strength representation of the signal.

13. The signal strength detection module of claim 12, wherein the memory element further comprises operational instructions that cause the processing module to adjust the at least one of the signal strength representation of the signal and the signal strength representation of the reference signal by:

adjusting the voltage-to-current factor when converting the AC voltage level of the reference signal into the reference MS current to adjust the signal strength representation of the reference signal; and adjusting the voltage-to-current factor when converting the AC voltage level of the signal into the MS current to adjust the signal strength representation of the signal.

14. The signal strength detection module of claim 12, wherein the memory element further comprises operational instructions that cause the processing module to adjust the at least one of the signal strength representation of the signal and the signal strength representation of the reference signal by at least one of:

amplifying the reference signal based on a first adjustable gain prior to generating the signal strength representation of the reference signal, wherein the first adjustable gain is set based on the comparing of the signal strength representation of the signal with the signal strength representation of the reference signal; and amplifying the signal based on a second adjustable gain prior to generating the signal strength representation of the signal, wherein the second adjustable gain is set based on the comparing of the signal strength representation of the signal with the signal strength representation of the reference signal.

15. A signal strength detection module comprising:

a processing module; and a memory element operably coupled to the processing module, wherein the memory element includes operational instructions that cause the processing module to:

compare a signal strength representation of a signal with a signal strength representation of a reference signal; and determine signal strength of the signal based on the comparing of the signal strength representation of the signal with the signal strength representation of the reference signal;

wherein the memory element further comprises operational instructions that cause the processing module to:

generate a signal strength difference indication based on the comparing of the signal strength representation of a signal with the signal strength representation of a reference signal; and determine the signal strength of the signal based on the signal strength difference and a known signal strength of the reference signal;

wherein the memory element further comprises operational instructions that cause the processing module to:

perform a signal metric conversion on an AC voltage level of the reference signal to produce the signal strength representation of the reference signal, wherein the AC voltage level of the reference signal is at a known AC voltage; and perform the signal metric conversion on an AC voltage level of the signal to produce the signal strength representation of the signal;

wherein the signal metric conversion comprises a mean square computation;

wherein the memory element further comprises operational instructions that cause the processing module to process the mean square (MS) computation by:

converting the AC voltage level of the reference signal into a reference MS current based on a square of the AC voltage level of the reference signal and a voltage-to-current factor to produce the signal strength representation of the reference signal; and converting the AC voltage level of the signal into an MS current based on a square of the AC voltage level of the signal and the voltage-to-current factor to produce the signal strength representation of the signal.

16. A signal strength detection module comprising:
a processing module; and
a memory element operably coupled to the processing module, wherein the memory element includes operational instructions that cause the processing module to:
compare a signal strength representation of a signal with a signal strength representation of a reference signal; and
determine signal strength of the signal based on the comparing of the signal strength representation of the signal with the signal strength representation of the reference signal;

wherein the memory element further comprises operational instructions that cause the processing module to determine signal strength of the signal by:

adjusting at least one of the signal strength representation of the signal and the signal strength representation of the reference signal until the signal strength representation of the signal substantially equals the signal strength representation of the reference signal, wherein the adjusting at least one of the signal strength representation of the signal and the signal strength representation of the reference signal includes at least one of:

adjusting the voltage-to-current factor when converting the AC voltage level of the reference signal into the reference MS current to adjust the signal strength representation of the reference signal; and adjusting the voltage-to-current factor when converting the AC voltage level of the signal into the MS current to adjust the signal strength representation of the signal.

17. A radio receiver comprising:
a low noise amplifier section operably coupled to amplify a radio frequency (RF signal in accordance with a gain setting to produce an amplified RF signal;
a down conversion module operably coupled to convert the amplified RF signal into a near DC signal;
a decoding module operably coupled to decode the near DC signal into a digitized signal;
an automatic gain control module operably coupled to produce the gain setting based on signal strength of the RF signal; and
a signal strength detection module operably coupled to determine the signal strength of the RF signal based on a signal strength representation of the RF signal and a signal strength representation of a reference signal;
wherein the signal strength detection module comprises:
a first signal metric conversion module operably coupled to convert an AC voltage level of the RF signal into a signal strength representation of the RF signal;
a second signal metric conversion module operably coupled to convert an AC voltage level of the reference signal into the signal strength representation of the reference signal;
a relational module operably coupled to establish a relationship between the signal strength representation of the signal and the signal strength representation of the reference signal; and
adjustable input module operably coupled to provide the reference signal to the second signal metric conversion module based on the relationship between the signal strength representation of the signal and the signal strength representation of the reference signal.

18. The radio receiver of claim 17, wherein the signal strength detection module further comprises:
the first signal metric conversion module includes a first transistor having an input, a first node, and a second node, wherein the input of the first transistor is operably coupled to receive the RF signal, wherein the second node of the first transistor is operably coupled to a return, and wherein the signal strength representation of the RF signal is provided at the first node of the first transistor, the second signal metric conversion module includes a second transistor having an input, a first node, and a second node, wherein the input of the second transistor is operably coupled to receive an adjusted reference signal from the adjustable input module, wherein the second node of the second transistor is operably coupled to the return, and wherein the signal strength representation of the reference signal is provided at the first node of the second transistor; and
the relational module includes a third transistor and a fourth transistor, wherein inputs of the third and fourth transistors are operably coupled to the first node of the second transistor, wherein first nodes of the third and fourth transistors are operably coupled to a voltage supply, wherein the second node of the third transistor is operably coupled to the first node of the first transistor, and wherein the second node of the fourth transistor is operably coupled to the first node of the second transistor.

19. The radio receiver of claim 17, wherein the adjustable input module comprises:
a counter operably coupled to count up or down based on a logic state of the first node of the first transistor to produce a count; and
a divider module operably coupled to divide a voltage level of the reference signal based on the count.

20. The radio receiver of claim 17 wherein the signal strength detection module comprises:
a processing module; and
a memory element operably coupled to the processing module, wherein the memory element includes operational instructions that cause the processing module to:

compare the signal strength representation of the RF signal with the signal strength representation of the reference signal;

when the signal strength representation of the RF signal compares unfavorably with the signal strength representation of the reference signal, adjust at least one of the signal strength representation of the RF signal and the signal strength representation of the reference signal until the signal strength representation of the RF signal compares favorably with the signal strength representation of the reference signal; and determine signal strength of the RF signal based on the adjusting of the signal strength representation of the RF signal and signal strength of the reference signal.

21. The radio receiver of claim 17 wherein the signal strength detection module comprises:

a processing module; and a memory element operably coupled to the processing module, wherein the memory element includes operational instructions that cause the processing module to:

compare the signal strength representation of the RF signal with the signal strength representation of the reference signal; and determine signal strength of the RF signal based on the comparing of the signal strength representation of the RF signal with the signal strength representation of the reference signal.

\* \* \* \* \*